United States Patent
Maleville et al.

(10) Patent No.: US 7,071,077 B2
(45) Date of Patent: Jul. 4, 2006

(54) METHOD FOR PREPARING A BONDING SURFACE OF A SEMICONDUCTOR LAYER OF A WAFER

(75) Inventors: Christophe Maleville, La Terrasse (FR); Corinne Maunand Tussot, Meylan (FR)

(73) Assignee: S.O.I.Tec Silicon on Insulator Technologies S.A., Bernin (FR)

(*) Notice: Subject to any disclaimer, the term of this patent is extended or adjusted under 35 U.S.C. 154(b) by 26 days.

(21) Appl. No.: 10/808,288

(22) Filed: Mar. 25, 2004

(65) Prior Publication Data
US 2004/0209441 A1   Oct. 21, 2004

Related U.S. Application Data

(60) Provisional application No. 60/489,275, filed on Jul. 22, 2003.

(30) Foreign Application Priority Data
Mar. 26, 2003 (FR) .................................. 03 03699

(51) Int. Cl.
*H01L 21/30* (2006.01)
(52) U.S. Cl. ................ 438/455; 438/974; 257/E21.122
(58) Field of Classification Search ................ 438/115, 438/118, 455, 758, 906, 471, 974; 257/E21.122
See application file for complete search history.

(56) References Cited

U.S. PATENT DOCUMENTS

| | | | |
|---|---|---|---|
| 2,961,354 A * | 11/1960 | Cleveland | 438/765 |
| 5,727,578 A * | 3/1998 | Matthews | 134/61 |
| 5,776,296 A * | 7/1998 | Matthews | 156/345.11 |
| 5,911,837 A * | 6/1999 | Matthews | 134/2 |
| 6,124,210 A * | 9/2000 | Chino et al. | 438/706 |
| 6,165,279 A * | 12/2000 | Tsao et al. | 134/3 |
| 6,239,045 B1* | 5/2001 | Tanaka et al. | 438/507 |
| 6,240,933 B1* | 6/2001 | Bergman | 134/1.3 |
| 6,273,108 B1* | 8/2001 | Bergman et al. | 134/102.1 |
| 6,312,797 B1 | 11/2001 | Yokokawa et al. | 428/336 |
| 6,562,127 B1* | 5/2003 | Kud et al. | 117/94 |
| 6,591,845 B1* | 7/2003 | Bergman et al. | 134/100.1 |
| 6,689,284 B1* | 2/2004 | Nakasaki | 216/64 |
| 6,830,628 B1* | 12/2004 | Bergman | 134/3 |
| 6,843,857 B1* | 1/2005 | Bergman | 134/28 |
| 6,849,192 B1* | 2/2005 | Nakasaki | 216/64 |

(Continued)

FOREIGN PATENT DOCUMENTS

EP   0971 396 A1   1/2000

OTHER PUBLICATIONS

Stanely Wolf and Richard N. Tauber, Silicon Processing For The VLSI Era, 2000, Lattice Press, Second Edition, pp. 130-131.*

(Continued)

*Primary Examiner*—Michael Lebentritt
*Assistant Examiner*—Stanetta Isaac
(74) *Attorney, Agent, or Firm*—Winston & Strawn LLP

(57) ABSTRACT

A method for preparing a bonding surface of a semiconductor layer of a wafer is described. The method includes treating the bonding surface to oxidize contaminants, and then cleaning the bonding surface to remove essentially all remaining contaminants. Ozone is then used to oxidize the bonding surface to improve the hydrophilic properties of the bonding surface. In an implementation, two wafers are prepared and then bonded together to form a structure.

18 Claims, 1 Drawing Sheet

U.S. PATENT DOCUMENTS

| | | | |
|---|---|---|---|
| 7,018,909 B1 * | 3/2006 | Ghyselen et al. | 438/455 |
| 2001/0027799 A1 * | 10/2001 | Bergman | 134/3 |
| 2002/0020436 A1 * | 2/2002 | Bergman | 134/30 |
| 2002/0062841 A1 | 5/2002 | Twu et al. | 134/3 |
| 2002/0155709 A1 * | 10/2002 | Toshima et al. | 438/689 |
| 2003/0060020 A1 * | 3/2003 | Walitzki et al. | 438/455 |
| 2003/0104696 A1 * | 6/2003 | Okamoto et al. | 438/689 |
| 2005/0016687 A1 * | 1/2005 | Shinriki et al. | 156/345.52 |

OTHER PUBLICATIONS

Seiji Fujino et al.., "Silicon Wafer Direct Bonding through the Amorphous Layer", Jp.n.. J. Appl. Phys., vol. 34, pp. 1322-1324 (1995).

* cited by examiner

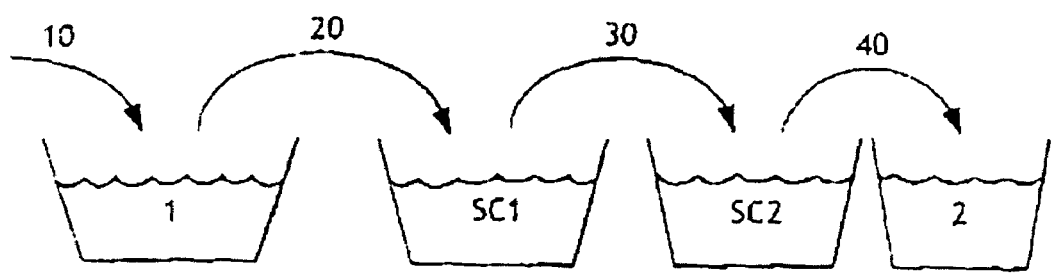

METHOD FOR PREPARING A BONDING SURFACE OF A SEMICONDUCTOR LAYER OF A WAFER

This application claims the benefit of provisional application Ser. No. 60/489,275 filed Jul. 22, 2003, the entire content of which is expressly incorporated herein by reference thereto.

BACKGROUND ART

The invention generally relates to preparing a bonding surface of a semiconductor layer of a wafer. In particular, the invention concerns the preparation of the bonding surfaces of two wafers of semiconductor materials to create structures to be used in microelectronics, optics and optoelectronics.

To ensure quality contact prior to bonding two wafers, the bonding surfaces must be cleaned. Traditional cleaning techniques include immersing the wafers in baths of successive cleaning solutions.

It is known to clean semiconductor-material wafers by using a so called RCA treatment. Such treatment includes an initial bath of an SC1 solution (Standard Clean 1), containing ammonium hydroxide ($NH_4OH$), hydrogen peroxide ($H_2O_2$) and deionized water. A second bath is then used, called an SC2 solution (Standard Clean 2), containing hydrochloric acid (HCl), hydrogen peroxide ($H_2O_2$) and deionized water. The initial bath principally removes isolated particles from the surface of the wafer and encrusted particles near the surface, and prevents them from resettling. The SC2 solution principally removes metallic contamination that may have settled on the surface of the wafer, which may form chlorides.

However, RCA treatments sometimes are insufficient, as such treatments remove little or none of the organic contaminants. Further, the organic contaminants can inhibit the efficient removal of matter by the RCA treatment. The contaminants can also adversely affect the quality of the bonding of the wafers if on the bonding interface. This occurs when one of the two wafers has been subjected to an implantation of atomic species near a bonding surface and then is followed by detachment of the implanted zone during a SMART-CUT® process. Hydrocarbons can, in the presence of particles, lead to the development of superficial blisters on the wafer. The blisters are typically created after detachment and may occur on non-transferred zones between the zone near where the species were implanted and the surface of the wafer. The blisters increase and/or are amplified during a heat treatment, such as a heat treatment performed during bonding to strengthen the bond. The hydrocarbons, or organic contaminants, may cause bonding problems.

Wafers to be bonded are usually immersed in a bath of CARO, which is a solution that contains $H_2SO_4$ and $H_2O_2$, at a temperature in excess of 100° C. to remove organic contaminants. This solution is expensive and poses safety and environmental problems. Furthermore, the CARO solution is difficult to apply in some cases, for example, when processing twelve-inch wafers. Moreover, cleaning processes using the CARO solution require intermediate stages between the CARO solution bath and the RCA treatment. Such stages include subjecting the wafer to at least two rinsing baths to remove any trace of the CARO solution present on the surface, prior to immersing the wafer in the SC1 solution.

Thus, a known cleaning process replaces the CARO solution with an ozone solution (O3). The ozone solution is capable of removing hydrocarbons present on the surface of the wafer due to oxidation, is less expensive, is safer, and is an environmentally less dangerous solution. In addition, the ozone bath treatment does not require intermediate rinsing stages. Ultrasonic waves, also known as megasonic waves, can be used with the ozone solution to facilitate the removal of particles. Furthermore, the bonding between two wafers can initially be achieved via molecular adhesion, which is related to the hydrophilic properties of the bonding surfaces. However, after applying a treatment using a CARO solution or an ozone solution, followed by an RCA treatment, the hydrophilic properties of the bonding surface do not differ greatly from that present prior to using such a process.

SUMMARY OF THE INVENTION

Presented is a method for preparing a bonding surface of a semiconductor layer of a wafer. The method includes treating the bonding surface to oxidize contaminants, cleaning the bonding surface to remove essentially all remaining contaminants, and oxidizing the bonding surface with ozone to improve the hydrophilic properties of the bonding surface.

In an advantageous implementation, cleaning of the bonding surface includes treating the bonding surface with a first solution capable of removing isolated and encrusted particles, and then treating the bonding surface with a second solution capable of removing metallic contamination. The first solution may be a SC1 solution that includes ammonium hydroxide ($NH_4OH$), hydrogen peroxide ($H_2O_2$) and deionized water, and the second solution may be a SC2 solution that includes hydrochloric acid (HCl), hydrogen peroxide ($H_2O_2$) and deionized water. Ultrasonic energy may be used during the cleaning step to assist in removing particulate contamination from the bonding surface.

In another advantageous implementation, a bonding surface of a second wafer may be prepared by treating the bonding surface to oxidize contaminants, cleaning the bonding surface to remove essentially all remaining contaminants, and oxidizing the bonding surface with ozone to improve the hydrophilic properties of the bonding surface. This technique may then be followed by contacting the bonding surface of the first wafer to the bonding surface of the second wafer to effect bonding therebetween and form a structure. A heat treatment may be advantageously applied to the structure to strengthen the bond between the first and second wafers. The bonding surface of the second wafer may advantageously exist on an oxide layer which may be an insulating layer, and the semiconductor structure may be a semiconductor on insulator (SOI) structure. At least one of the first or second wafers may advantageously include a zone of weakness to facilitate detachment of the structure.

The present invention thus provides a method for preparing a bonding surface of a semiconductor layer of a wafer for bonding to a second wafer wherein the bonding surface is cleaned to remove contaminants, and the bonding surface is oxidized with ozone to improve the hydrophilic properties of the bonding surface.

BRIEF DESCRIPTION OF THE DRAWING

Other aspects, purposes and advantages of the invention will become clear after reading the following description with reference to the attached drawing, in which:

FIG. 1 illustrates the different stages of a process according to the invention.

DETAILED DESCRIPTION OF THE PREFERRED EMBODIMENTS

The present method is an improved technique for preparing a bonding surface of semiconductor material of a wafer, wherein the bonding surface is intended for adhesion to a surface of a second wafer. In particular, the method relates to removing hydrocarbon contaminants from the bonding surface of the wafer. The invention also provides a method for improving the hydrophilic properties of the bonding surface.

With regard to semiconductor technology, two wafers are bonded to create structures such as silicon-on-insulator (SOI), or transistor assemblies, or other types of structures. The quality of the bond depends on the smoothness of the surfaces that are to be bonded together, and/or on the adhesive properties between the wafers, and/or on the amount of contaminants (organic or metallic) near the bonding surfaces.

The present treatment removes any hydrocarbon contaminants by bringing the bonding surface of the wafer into contact with an ozone solution so as to generate the following chemical reaction:

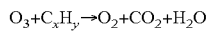
$$O_3 + C_xH_y \rightarrow O_2 + CO_2 + H_2O$$

Hydrocarbons are thus removed because they are oxidized by the ozone. The ozone solution also removes some metallic contaminants such as copper or silver. An ozone bath also improves the adhesive qualities of the bonding surfaces of the two wafers if adhesion is achieved, at least primarily, via hydrophilic adhesion.

The presence of ozone on the surface of the wafer increases hydrophilicity, meaning that when a drop of water is placed on the surface of the wafer, it takes the shape of a spherical cap whose connection angle between the surface of the wafer and the tangent to the surface of the liquid, known as the contact angle, is smaller than when no ozone is present on the surface of the wafer. For a wafer immersed in an ozone bath the contact angle normally lies between about 5 and 15 degrees, which characterizes a hydrophilic surface. Such surfaces are said to have a high level of wettability. Thus, a dual benefit is achieved when the bonding surface of a wafer is brought into contact with an ozone solution.

FIG. 1 illustrates an implementation of the process for treating the bonding surface of a wafer. A series of chemical treatments is applied with the principal purpose of reducing the superficial roughness of the wafer and thus increasing its hydrophilic properties. A first stage of the process consists of subjecting 10 the wafer to an ozone fluid 1 (gas or liquid). The first stage removes the majority of organic contaminants, such as hydrocarbons, from the surface of the wafer to avoid bonding faults. This also prevents structural deterioration of the bonding interface, which may result in deterioration of the finished structures. For example, bonding after implanting atomic species at a shallow depth to the surface during application of a SMART-CUT® process, known to those skilled in the art, can cause such deterioration, notably during heat treatment.

Another benefit of putting the wafer into contact with an ozone bath is that organic contaminants, such as hydrocarbon waste, delay the attack of the SC1 solution of the RCA treatment applied during the second stage. In addition, removing this contamination restores the etching speed of the SC1 treatment, and thus improves the efficiency of the process (efficient removal of the particles being ensured by sufficient etching under the particles which are thus "suspended"). In fact, cartographic measurements of a wafer that had been subjected to a SC1 treatment with a preliminary stage of immersing the wafer in an ozone bath showed that the hydrocarbons protected the section of the wafer that they were covering. The other sections of the wafer that were not covered by hydrocarbon contaminants were treated via chemical etching applied with the SC1 solution. Thus, the SC1 treatment did not uniformly etch the surface and therefore the bonding surface had a fairly uneven level of roughness. In contrast, a wafer that was treated with an SC1 solution after having been immersed in an ozone bath had a more even surface roughness. The application of an organic decontamination stage just prior to the application of an SC1 treatment thus improves the efficiency of the SC1 treatment.

An attack on the surface of the wafer with a solution comprising some CARO, in accordance with the state of the art, was also compared to contacting the surface of the wafer with an ozone solution. The thickness of the superficial layers before and after cleaning demonstrated that the efficiency of hydrocarbon oxidation was practically identical for the two solutions. But the treatment of the wafer with an ozone solution does not require an intermediate rinsing stage between the treatment of organic contaminants and the RCA treatment, as was the case when the wafer was treated with a CARO solution.

The present process also subjects the wafer to a treatment to remove isolated particles and metallic contaminants from the surface. This second stage advantageously includes an RCA type treatment. Such an RCA treatment stage includes two principal operations. First, a treatment 20 with an SC1 solution to remove the isolated particles on the surface of the wafer and/or encrusted near the surface of the latter. Second, a treatment 30 with an SC2 solution to remove metallic contamination that may have settled on the surface of the wafer. The RCA treatment is advantageously applied in association with application of ultrasonic waves, also known as megasonic waves, to assist with the removal of particles.

The present process also includes exposing 40 the wafer to a second ozone fluid 2 to increase the hydrophilic properties on the surface of the wafer to improve the adhesive properties of the wafer for bonding to another wafer. A wafer subjected to an initial ozone treatment 1 during the first stage loses at least a large part of its hydrophilic properties during the subsequent RCA treatment. This loss could generate poor quality bonding. Thus, a principal benefit of treating the bonding surface with a second ozone fluid 2 is to restore the good hydrophilic properties. The hydrophilic properties are notably increased due to the surface activation properties associated with the presence of ozone on the surface of the wafer. This high hydrophilicity is associated with the formation of the oxide layer via oxidation by the ozone of the surface of the wafer.

The wafer may be exposed to an ozone fluid according to one of the following techniques. First, the wafer may be immersed in an ozone bath. Second, ozone droplets may be sprayed onto the bonding device, alone or advantageously accompanied with a rinsing using deionized water, to establish an ozone rinse solution. Third, an ozone gas may be provided.

Once the bonding surfaces of the two wafers have been prepared, one or several bonding stages may be applied. Bonding may advantageously consist of a hydrophilic adhesion. In an advantageous additional stage, the bonding is solidified by another treatment, such as a heat treatment.

An oxide layer may be formed during the oxidation of one of the bonding surfaces of at least one of the two wafers, or during another oxidation stage. Such an oxide layer can improve the adhesive properties between the two wafers due to its bonding properties.

After bonding, an additional stage can be applied to detach a film from one of the two wafers and transfer it to the other wafer, to create a desired structure on a semiconductor structure including the second wafer. In the case where one of the two bonding surfaces includes an oxide layer, the oxide layer can in some applications of the finished structure be an electrically insulating layer. Thus, an SeOI (Semiconductor On Insulator) structure can be formed, whose semiconductor thickness consists of the transferred film and the insulating layer. The insulating layer includes the oxide layer that formed when at least one of the two wafers was exposed to the ozone fluid.

The present invention is not restricted to making a SeOI-type structure, but relates to all types of structures comprising semiconductor materials. The treated wafers may include semiconductor materials such as silicon, germanium, SiGe, AlGaAs, GaAS, InGaAs, AlGaAsP, InGaAsP, InP, or other materials of Group III–Group V semiconductor or Group II–Group VI semiconductor.

What is claimed is:

1. A method for preparing a bonding surface of a semiconductor layer of a wafer comprising:
    treating the bonding surface to oxidize contaminants;
    cleaning the bonding surface to remove essentially all remaining contaminants; and then
    oxidizing the bonding surface with ozone to improve the hydrophilic properties of the bonding surface.

2. The method of claim 1 wherein the cleaning of the bonding surface comprises treating the bonding surface with a first solution capable of removing isolated and encrusted particles, and then treating the bonding surface with a second solution capable of removing metallic contamination.

3. The method of claim 2 wherein the first solution is a SC 1 solution that includes ammonium hydroxide ($NH_4OH$), hydrogen peroxide ($H_2O_2$) and deionized water.

4. The method of claim 2 wherein the second solution is a SC2 solution that includes hydrochloric acid (HCl), hydrogen peroxide ($H_2O_2$) and deionized water.

5. The method of claim 1 wherein the cleaning step includes applying ultrasonic energy to assist in removing particulate contamination from the bonding surface.

6. The method of claim 1 wherein the oxidizing comprises at least one of immersing the bonding surface in an ozone bath, or spraying ozone droplets onto the bonding surface, or exposing the bonding surface to an ozone gas.

7. The method of claim 1 which further comprises preparing a bonding surface of a second wafer by treating the bonding surface to oxidize contaminants, cleaning the bonding surface to remove essentially all remaining contaminants, and oxidizing the bonding surface with ozone to improve the hydrophilic properties of the bonding surface, followed by contacting the bonding surface of the first wafer to the bonding surface of the second wafer to effect bonding therebetween and form a structure.

8. The method of claim 7 wherein the bonding is at least partly achieved by hydrophilic adhesion of the bonding surfaces of the first and second wafers.

9. The method of claim 7 further comprises applying a heat treatment to the structure to strengthen the bond between the first and second wafers.

10. The method of claim 7 wherein the bonding surface of the second wafer exists on an oxide layer.

11. The method of claim 10 wherein the semiconductor structure is a semiconductor on insulator (SOI) structure.

12. The method of claim 10 wherein the oxide layer is an insulating layer.

13. The method of claim 7 wherein the bonding surfaces of each of the first and second wafers exist on an oxide layer.

14. The method of claim 13, wherein each oxide layer is an insulating layer.

15. The method of claim 7, wherein at least one of the first or second wafers includes a zone of weakness to facilitate detachment of the structure.

16. The method or claim 7, wherein the semiconductor wafer comprises silicon, germanium, SiGe, AlGaAs, GaAS, InGaAs, AlGaAsP, InGaAsP, InP, or another Group III-–Group V semiconductor or Group II–Group VI semiconductor.

17. The method of claim 1, wherein the first wafer includes a zone of weakness to facilitate detachment of a layer that includes the bonding surface.

18. In a method for preparing a bonding surface of a semiconductor layer of a wafer for bonding to a second wafer wherein the bonding surface is cleaned to remove contaminants, the improvement which comprises oxidizing the bonding surface with ozone after the surface is cleaned to improve the hydrophilic properties of the bonding surface.

* * * * *